United States Patent
Richardson

(10) Patent No.: US 7,369,399 B2
(45) Date of Patent: May 6, 2008

(54) MODULAR ELECTRONIC CONTROL UNIT HOUSING

(75) Inventor: Mike Richardson, Upminster (GB)

(73) Assignee: CNH America LLC, New Holland, PA (US)

( * ) Notice: Subject to any disclaimer, the term of this patent is extended or adjusted under 35 U.S.C. 154(b) by 156 days.

(21) Appl. No.: 11/416,272

(22) Filed: May 2, 2006

(65) Prior Publication Data

US 2006/0256535 A1    Nov. 16, 2006

(30) Foreign Application Priority Data

May 4, 2005    (GB) ................................. 0509053.5

(51) Int. Cl.
*H05K 5/00* (2006.01)
(52) U.S. Cl. .................. 361/679; 257/678; 439/620.1; 174/530
(58) Field of Classification Search .......... 365/185.08, 365/226; 439/587, 271, 620.1; 174/529, 174/530; 362/295, 105; 361/679–687, 724–727; 257/678, 679
See application file for complete search history.

(56) References Cited

U.S. PATENT DOCUMENTS

| | | | |
|---|---|---|---|
| 2003/0111716 A1* | 6/2003 | Ano | 257/678 |
| 2007/0146974 A1* | 6/2007 | Cabuz et al. | 361/679 |
| 2007/0184722 A1* | 8/2007 | Doherty | 439/638 |
| 2007/0207071 A1* | 9/2007 | Silverman et al. | 422/186.07 |

* cited by examiner

*Primary Examiner*—Hung Van Duong
(74) *Attorney, Agent, or Firm*—Patrick M. Sheldrake; John William Stader; Michael G. Harms

(57) ABSTRACT

A housing module 10 for a circuit board comprises a first chamber 20 for accommodating a main part of the circuit board and a second chamber 22 bordering the first chamber 20 and having a greater depth that the first chamber 20 to enable it to accommodate a connector 16 located along an edge of the circuit board and protruding above the surface of the circuit by an amount exceeding the depth of the first chamber 20. The exterior of the module 10 is shaped to enable two similar modules 10 to be stacked with the first chambers 20 overlying one another and with the second chambers 22 circumferentially staggered around the stack, thereby and acting to maintain the modules of the stack in alignment with one another.

6 Claims, 2 Drawing Sheets

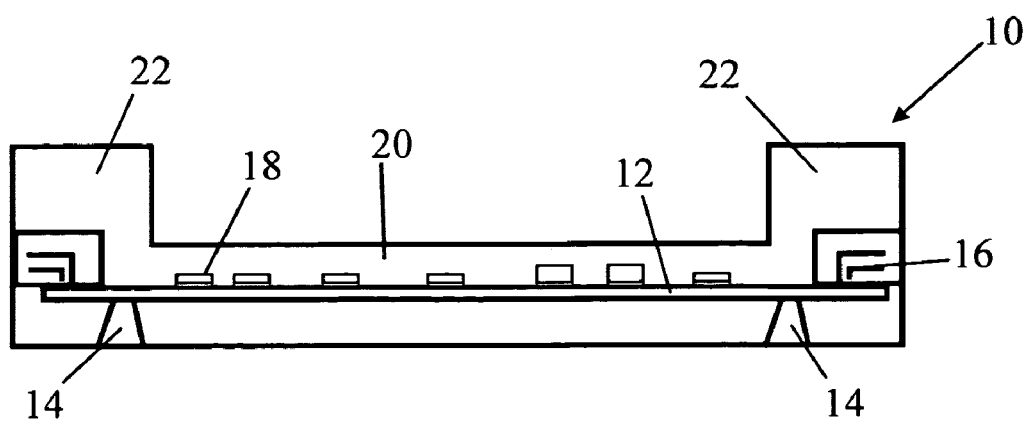
Fig. 1
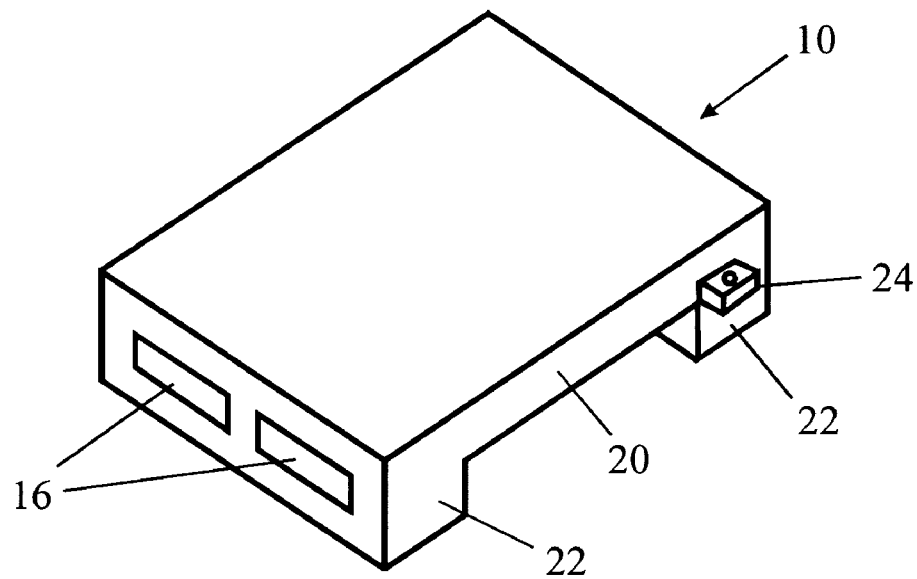
Fig. 2
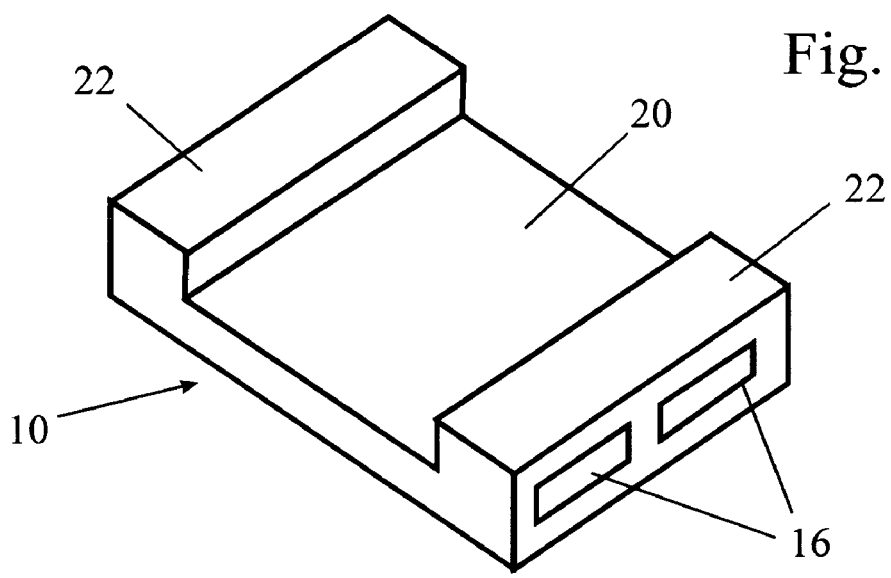

MODULAR ELECTRONIC CONTROL UNIT HOUSING

FIELD OF THE INVENTION

The present invention relates to a housing module for a circuit board and is particularly intended for housing electronic control units in a vehicle.

BACKGROUND OF THE INVENTION

Agricultural vehicles may sometimes have two or more electronic control units (ECU's). For example, there may be an ECU for engine management and others to control an implement or to control some other specific function performed by the vehicle.

Hitherto, ECU's are housed in separate housing modules which were shaped as a rectangular box. The height of the box needs to be sufficient to clear the circuit components mounted on the board, of which the highest is usually a connector which enables a set of wires to be plugged into the board. In the past, other components could also protrude significantly from the circuit board but with more modern circuit boards making use of surface mount technology, the board is itself slim and it is mainly the connectors that dictate the height of the housing.

When conventional housing modules are stacked above one another, the height of the stack is equal to the sum of the heights of the individual modules and the space needed to house the ECU's is considerable.

OBJECT OF THE INVENTION

The invention seeks therefore to provide a housing module that can be stacked in a more compact manner and reduces the space required to accommodate a plurality of electronic control units.

SUMMARY OF THE INVENTION

According to the present invention, there is provided a housing module for a circuit board, comprising a first chamber for accommodating a main part of the circuit board and a second chamber bordering the first chamber and having a greater depth than the first chamber to enable the second chamber to accommodate a connector located along an edge of the circuit board and protruding above the surface of the circuit board by an amount exceeding the depth of the first chamber, wherein the exterior of the module is shaped to enable two similar modules to be stacked with the first chambers overlying one another and with the second chambers circumferentially staggered around the stack and acting to maintain the modules of the stack in alignment with one another.

In the invention, each individual module has a shallow portion having a height that is sufficient to accommodate a circuit board and deep portions having a height sufficient to accommodate connectors. When stacked, the deep portions of adjacent modules do not align with one another vertically and this allows the overall height of the stack to be dictated by the sum of the heights of the shallow portions of the modules. Hence, two ECU's can be mounted within a space which conventionally could only accommodate one ECU.

Conveniently, the first chamber of the housing module has parallel flat top and bottom surfaces which are each shaped as a regular polygon which is preferably a square but may alternatively be a hexagon or even an octagon. Indeed, it is not even necessary for the polygon to have an even number of sides.

In the preferred embodiment of the invention, two or more second chambers are provided on each module and they are disposed symmetrically about the axis of rotational symmetry of the first chamber.

Though the interlocking of the modules is sufficient to prevent a module from sliding off a stack, it does not prevent a module from being lifted off a stack. For this reason, it is desirable to provide an ear which projects from one of the sides of the first chamber in such a manner that the ears of stacked modules align with one another to enable the modules to be secured to one another.

BRIEF DESCRIPTION OF THE DRAWINGS

The invention will now be described further, by way of example, with reference to the accompanying drawings, in which:

FIG. 1 shown a section through a housing module of the invention with the circuit board of an ECU mounted within it, FIG. 2 shows how two of the modules of FIG. 1 can be interlocked to form a stack that can be mounted within a space only tall enough to receive one conventional module.

DETAILED DESCRIPTION OF THE PREFERRED EMBODIMENTS

Figure 3:
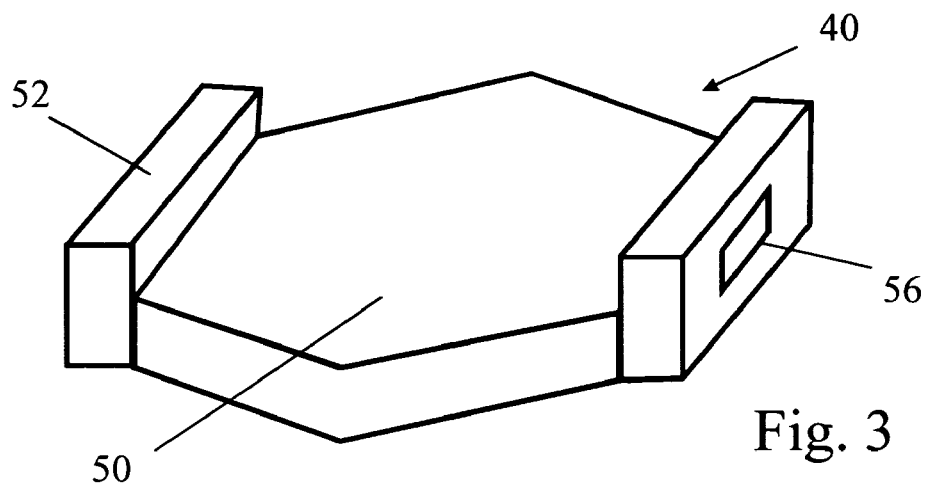
FIG. 3 shows a perspective view of a housing module in accordance with a second embodiment of the invention.

The housing module 10 in FIGS. 1 and 2 is formed as a box housing a circuit board 12 shown resting on posts 14, though such posts are not always required. Along its opposite edges, the circuit board has connectors 16 that are raised from the circuit board to a much greater extent than the surface mounted components 18. Hitherto, housing modules were rectangular boxes of uniform depth which meant that there was a great deal of unused space above the circuit board.

In the present invention, use is made of this space to enable modules to be stacked in a more compact manner. Thus, in FIG. 1, this space is removed by forming the housing module with a U-shaped cross section, defining a shallow chamber 20 for the circuit board and two contiguous deeper chambers 22 which accommodate the edges of the circuit board 12 carrying bulky connectors 16.

The chamber 20 is square when viewed in plan and it is flanked by the two deeper chambers 22. When one module is turned upside down and rotated through 90° about a vertical axis, as is shown in FIG. 2, the two modules can be stacked with their chambers 20 in contact with one another. Within the stack, the deep chambers 22 of each module straddle two side of the shallow chamber 22 of the other so that the two modules are interlocked. In this state, the two modules of a stack can be housed in a space only large enough to accommodate one conventionally housed ECU.

Within a stack of housing modules, the connectors are not arranged one above the other but are staggered around the periphery of the stack. Aside from the advantage of interlocking the modules, as described above, this also makes for neater wiring as the cables leading to the different modules can now be distinguished from one another more readily.

The interlocking only prevents the modules from sliding from one another. By providing two or more additional ears, such as the ear 24 shown in FIG. 2, it is possible to enable the modules to be fastened to one another. The ears may suitably have a thickness equal to half the height of a module so that they can be interconnected without being put under stress.

The embodiment of FIGS. 3 to 6 is intended to demonstrate that the invention is not restricted to a square chamber 20, though most circuit boards are currently manufactured in this shape. In FIGS. 3 to 6, each module 40 is shown having a hexagonal shallow chamber 50 flanked by two deeper chambers 52 on two sides, the deeper chambers 52 once again housing connectors 56.

Figure 4:
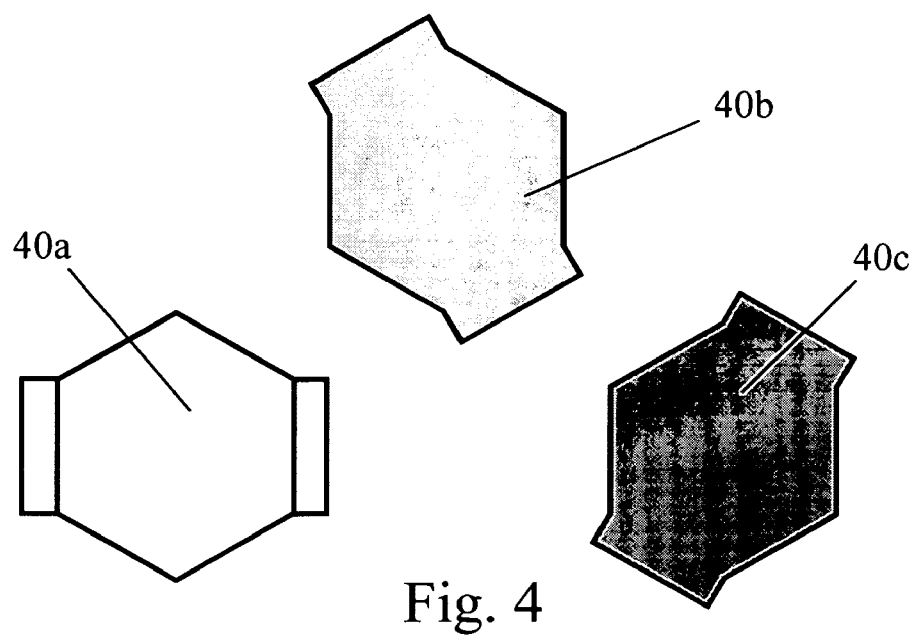
FIG. 4 shows a plan view of three housing modules of the type shown in FIG. 3.
Figure 5:
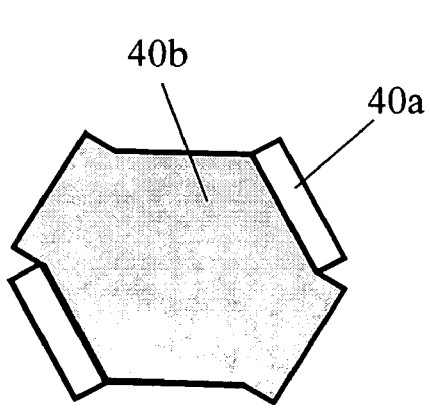
FIG. 5 shows a plan view of two of the housing modules of FIG. 4 stacked one above the other.
Figure 6:
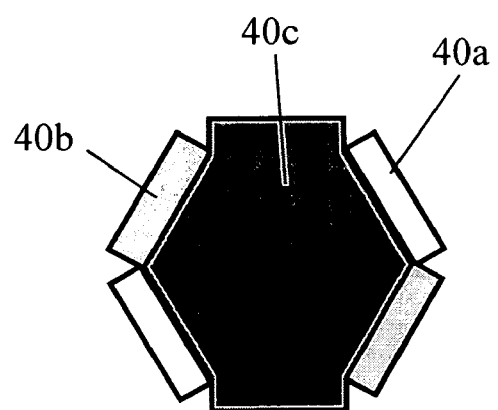
FIG. 6 shows a plan view of all three housing modules of FIG. 4 stacked one above the other.

FIG. 4 shows a plan of a first module 40*a* with its deeper chambers facing upwards and two further modules 40*b* and 40*c* which are each inverted and rotated by 60°. The module 40*b* can be dropped onto the module 40*a* to arrive at the stack shown in FIG. 5 and the module 40*c* can in turn be dropped onto the stack of FIG. 5 to form the stack shown in FIG. 6. In the stack of three modules, the full height of the stack is only as high as three times the height of the shallow chambers 50. The connectors of the modules 40*a* and 40*b* both extend from the bottom of the stack to two thirds of the way up the stack, whereas the connectors of the module 40*c* extend down from the top of the stack to one third of the way up the stack. All three modules including their deeper chambers are therefore contained within a space one and a half times the height of a conventional housing module.

It is an advantage of the housing modules of the invention that, as they are all identical, they can readily be reused as can the tooling used in their production.

The invention claimed is:

1. A housing module for a circuit board, comprising a first chamber for accommodating a main part of the circuit board and a second chamber bordering the first chamber and having a greater depth than the first chamber to enable the second chamber to accommodate a connector located along an edge of the circuit board and protruding above the surface of the circuit board by an amount exceeding the depth of the first chamber, wherein the exterior of the module is shaped to enable two similar modules to be stacked with the first chambers overlying one another and with the second chambers circumfererentially staggered around the stack and acting to maintain the modules of the stack in alignment with one another.

2. A housing module as claimed in claim 1, wherein the first chamber of the housing module has parallel flat top and bottom surfaces which are each shaped as a regular polygon.

3. A housing module as claimed in claim 2, wherein the regular polygon is a square.

4. A housing module as claimed in claim 2, wherein the regular polygon is a hexagon.

5. A housing module as claimed in claim 1, wherein two or more second chambers are provided which are disposed symmetrically about an axis of rotational symmetry of the first chamber.

6. A housing module as claimed claim 1, wherein an ear projects from one of the sides of the first chamber in such a manner that the ears of subsequent stacked modules align with one another to enable the modules to be secured to one another.

\* \* \* \* \*